(12) United States Patent
Christiansen et al.

(10) Patent No.: US 9,681,533 B2
(45) Date of Patent: Jun. 13, 2017

(54) APPARATUS AND METHOD FOR PROVIDING A TEMPERATURE-DIFFERENTIAL CIRCUIT CARD ENVIRONMENT

(71) Applicants: Martin Brokner Christiansen, Laurel, MD (US); Leonard George Chorosinski, Ellicott City, MD (US); H. Craig Heffner, Ellicott City, MD (US); Stanley Katsuyoshi Wakamiya, Ellicott City, MD (US); Keith R. Kirkwood, Columbia, MD (US)

(72) Inventors: Martin Brokner Christiansen, Laurel, MD (US); Leonard George Chorosinski, Ellicott City, MD (US); H. Craig Heffner, Ellicott City, MD (US); Stanley Katsuyoshi Wakamiya, Ellicott City, MD (US); Keith R. Kirkwood, Columbia, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 1 day.

(21) Appl. No.: 14/943,337

(22) Filed: Nov. 17, 2015

(65) Prior Publication Data
US 2017/0142820 A1 May 18, 2017

(51) Int. Cl.
*H05K 13/00* (2006.01)
*H05K 1/02* (2006.01)

(52) U.S. Cl.
CPC ....... *H05K 1/0204* (2013.01); *H05K 13/0023* (2013.01)

(58) Field of Classification Search
CPC .......................... H05K 1/0204; H05K 13/0023
(Continued)

(56) References Cited

U.S. PATENT DOCUMENTS

| 4,865,331 A | 9/1989 | Porter | |
|---|---|---|---|
| 2008/0218980 A1* | 9/2008 | Tracewell | H05K 7/20672 361/713 |

(Continued)

OTHER PUBLICATIONS

International Search Report for Application No. PCT/US2016/056444 dated Feb. 7, 2017.

*Primary Examiner* — Dion R Ferguson
*Assistant Examiner* — Mandeep S Buttar
(74) *Attorney, Agent, or Firm* — Tarolli, Sundheim, Covell & Tummino LLP

(57) ABSTRACT

An apparatus for, and method of, providing a desired temperature-differential circuit card environment includes a plurality of card units. Each card unit comprises a first thermal plate having front and back first plate sides oriented in a lateral-longitudinal plane, the first thermal plate operating at a first plate temperature. A second thermal plate has front and back second plate sides oriented in the lateral-longitudinal plane, the second thermal plate operating at a second plate temperature. A coupler is oriented in the lateral-longitudinal plane and is connected to front and/or back first plate sides and to the front and/or back second plate sides to form a card unit. The card units are arranged in a transversely oriented stack with the front first and second plate sides of a second card unit being directly transversely adjacent the back first and second plate sides of the first card unit.

16 Claims, 12 Drawing Sheets

(58) Field of Classification Search
USPC .................................................. 361/707, 713
See application file for complete search history.

(56) References Cited

U.S. PATENT DOCUMENTS

| | | |
|---|---|---|
| 2013/0182383 A1 | 7/2013 | Colbeau |
| 2015/0261266 A1* | 9/2015 | Dean .......................... G06F 1/20 |
| | | 361/679.46 |

* cited by examiner

APPARATUS AND METHOD FOR PROVIDING A TEMPERATURE-DIFFERENTIAL CIRCUIT CARD ENVIRONMENT

TECHNICAL FIELD

This disclosure relates to an apparatus and method for providing a circuit card environment and, more particularly, to a method and apparatus for providing a desired differential-temperature circuit card environment.

BACKGROUND

A circuit card is the current state of the art for building assemblies of electronic devices including a plurality of integrated circuits ("chips"). These assemblies can be separated into multiple types: organic multilayer laminated printed wire board (PWB), low temperature co-fired ceramic (LTCC), and high temperature co-fired ceramic (HTCC). Using each of these technologies, circuit card assemblies have been fabricated.

In a superconducting supercomputer, many of the operating processing integrated circuits ("chips") are cooled to about 4K, but certain of the memory chips instead have a much warmer operating temperature of about 77K. Providing cooling at 4K is a costly activity, so every effort is made in superconducting supercomputer design to reduce the thermal parasitic load. This includes placing the assembly in vacuum (no convection), use of coatings and multilayer insulation to reduce radiation, and limiting the conductive thermal load between the "hot side" and "cool side" of the entire assembly.

For large scale applications, the state of the art currently solves the problem of achieving the desired operating temperatures for a superconducting supercomputer while avoiding thermal parasitic load by using dewars for each of the cryogenic temperatures. A 4K dewar is maintained with liquid helium and a 77K dewar uses liquid nitrogen. Signals between the two temperature sides are completed by cabling. This solution requires cables that are long from a digital perspective, which results in significant latency between the 4K and 77K regions and would require more parts in the 4K stage. These additional parts consume significant power and make certain designs of superconducting supercomputers infeasible.

In small scale applications, a cryocooler can be used for both temperatures. The intermediate stage of the cryocooler provides a 77K platform while the final stage of the cryocooler provides a 4K stage. Connections between the two zones are completed by cabling. While this brings the two temperatures sides closer together, this approach is not scalable to large applications.

SUMMARY

In an embodiment, an apparatus for providing a desired temperature-differential circuit card environment is disclosed. A plurality of card units are provided. Each card unit comprises a substantially planar first thermal plate having front and back first plate sides oriented in a lateral-longitudinal plane and separated transversely by a first plate thickness which is significantly smaller than a length of the first thermal plate in both the lateral and longitudinal directions. The first thermal plate has an operative configuration at a first plate temperature. A substantially planar second thermal plate is provided, having front and back second plate sides oriented in substantially the same lateral-longitudinal plane as the first thermal plate. The front and back second plate sides are separated transversely by a second plate thickness which is significantly smaller than a length of the second thermal plate in both the lateral and longitudinal directions. The second thermal plate has an operative configuration at a second plate temperature which is different than the first plate temperature. A laterally extending plate coupler is oriented in substantially the same lateral-longitudinal plane as the first and second thermal plates. The plate coupler is connected to at least one of the front and back first plate sides. The plate coupler is connected to at least one of the front and back second plate sides to maintain the first and second thermal plates in relative longitudinal spacing to form a card unit. The plurality of card units is arranged in a transversely oriented stack with at least a portion of front first and second plate sides of a second card unit being directly transversely adjacent at least a corresponding portion of the back first and second plate sides of the first card unit.

In an embodiment, a method of providing a desired temperature-differential circuit card environment is disclosed. A plurality of card units is provided. Each card unit comprises a substantially planar first thermal plate having front and back first plate sides oriented in a lateral-longitudinal plane and separated transversely by a first plate thickness which is significantly smaller than a length of the first thermal plate in both the lateral and longitudinal directions. A substantially planar second thermal plate has front and back second plate sides oriented in substantially the same lateral-longitudinal plane as the first thermal plate. The front and back second plate sides are separated transversely by a second plate thickness which is significantly smaller than a length of the second thermal plate in both the lateral and longitudinal directions. A laterally extending plate coupler is oriented in substantially the same lateral-longitudinal plane as the first and second thermal plates. The plate coupler is connected to at least one of the front and back first plate sides and to at least one of the front and back second plate sides to maintain the first and second thermal plates in relative longitudinal spacing to form a card unit. The first thermal plate is configured for operation at a first plate temperature. The second thermal plate is configured for operation at a second plate temperature which is different than the first plate temperature. The plurality of card units is arranged in a transversely oriented stack with at least a portion of front first and second plate sides of a second card unit being directly transversely adjacent at least a corresponding portion of the back first and second plate sides of the first card unit.

In an embodiment, an apparatus for providing a desired temperature-differential circuit card environment is disclosed. Two longitudinally adjacent circuit card assemblies are maintained in close spatial proximity to each other, each at a different temperature. Thermal parasitic heat transfer between the two circuit card assemblies is low due to the presence of at least one of a plate coupler and a card connector longitudinally between the two circuit card assemblies.

BRIEF DESCRIPTION OF THE DRAWINGS

For a better understanding, reference may be made to the accompanying drawings, in which.

DESCRIPTION OF ASPECTS OF THE DISCLOSURE

This technology comprises, consists of, or consists essentially of the following features, in any combination.

It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "directly adjacent" another feature may have portions that overlap or underlie the adjacent feature, whereas a structure or feature that is disposed "adjacent" another feature may not have portions that overlap or underlie the adjacent feature.

Spatially relative terms, such as "under," "below," "lower," "over," "upper" and the like, may be used herein for ease of description to describe one element or feature's relationship to another element(s) or feature(s) as illustrated in the figures. It will be understood that the spatially relative terms can encompass different orientations of a device in use or operation, in addition to the orientation depicted in the figures. For example, if a device in the figures is inverted, elements described as "under" or "beneath" other elements or features would then be oriented "over" the other elements or features.

It will be understood that, although the terms "first," "second," etc. may be used herein to describe various elements, these elements should not be limited by these terms. These terms are only used to distinguish one element from another. Thus, a "first" element discussed below could also be termed a "second" element without departing from the teachings of the present disclosure. The sequence of operations (or steps) is not limited to the order presented in the claims or figures unless specifically indicated otherwise.

FIGS. 1-4 depict an apparatus 100 for providing a desired temperature-differential circuit card environment. The apparatus 100 includes a plurality of card units 102. While the apparatus 100 shown in the Figures includes twelve card units 102, it is contemplated that this highly scalable apparatus 100 could include as few as one card unit 102, or as many as several hundred or more card units 102, for a particular use application.

Figure 3:
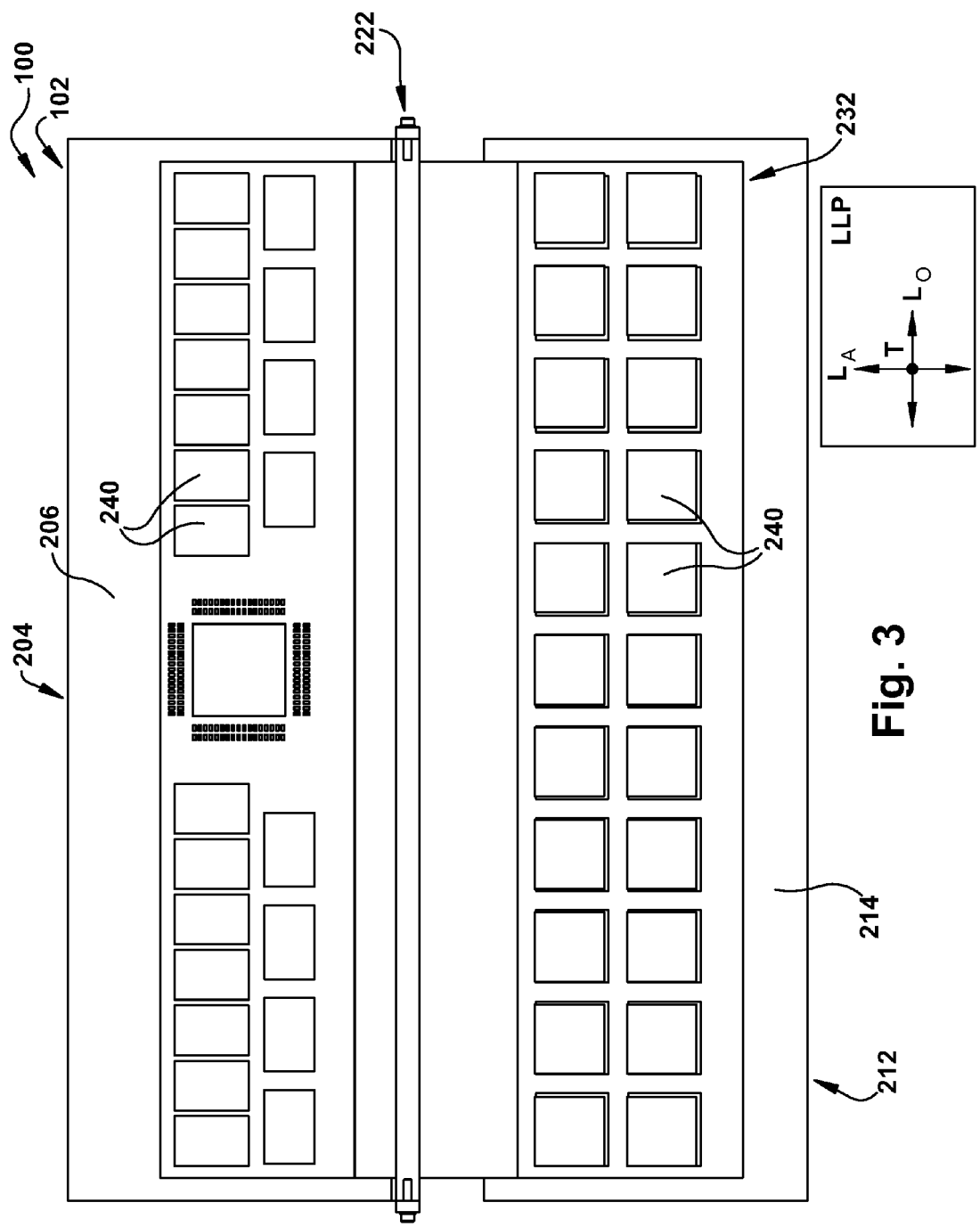
FIG. 3 is a front view of the aspect of FIG. 1.
Figure 4:
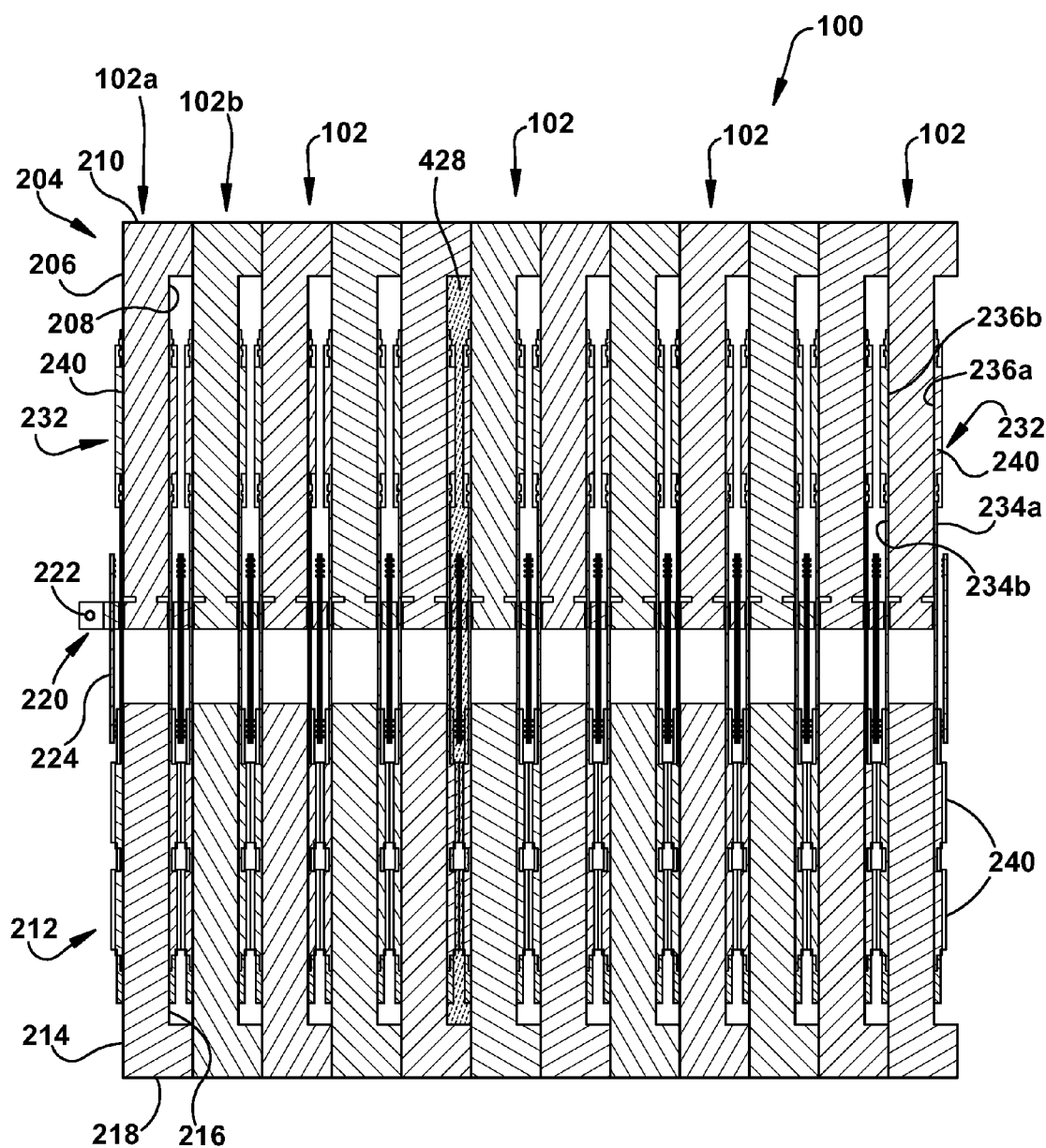
FIG. 4 is a sectional view taken along line 4-4 of FIG. 1.
Figure 5:
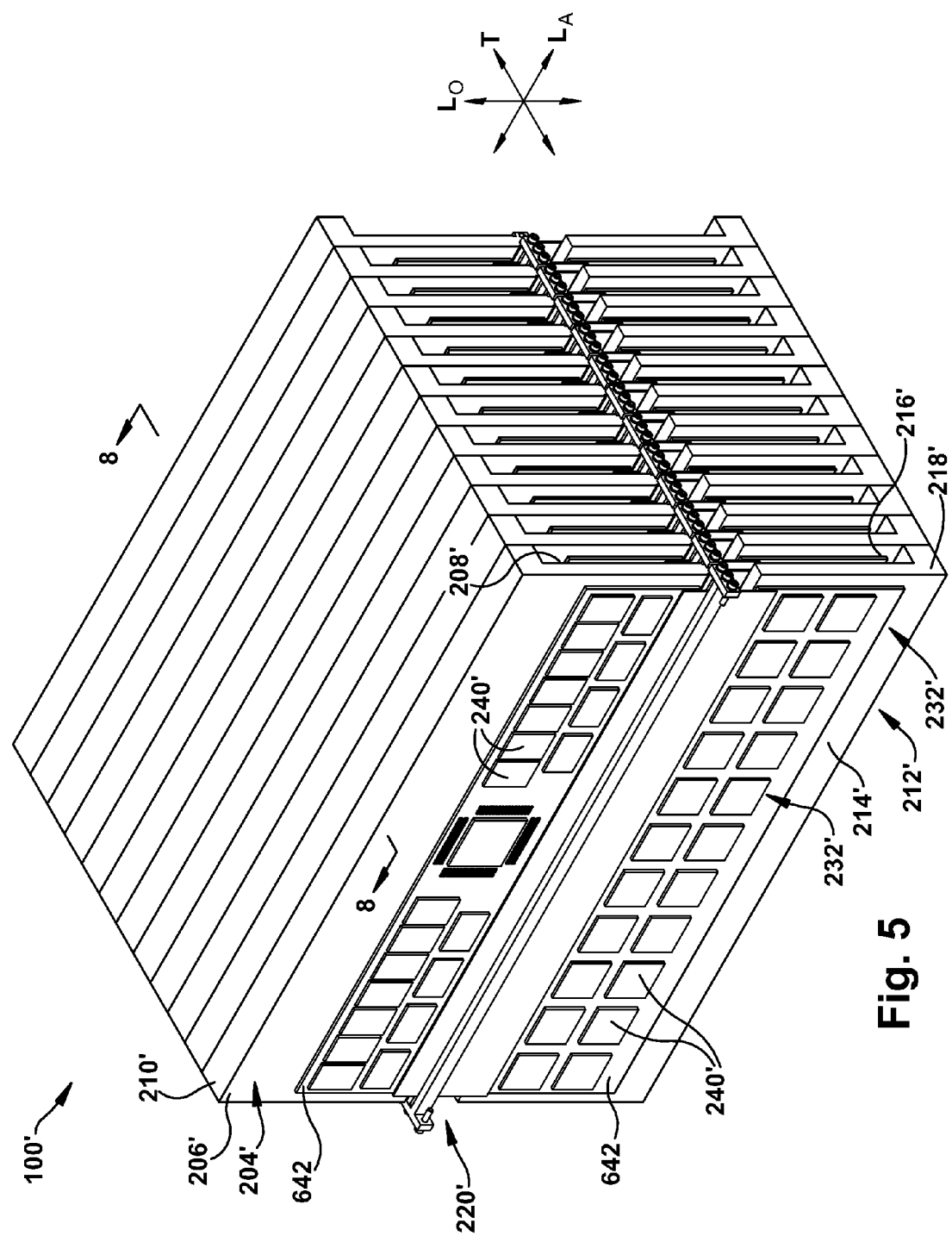
FIG. 5 is a perspective front view of the aspect of FIG. 1.
Figure 6:
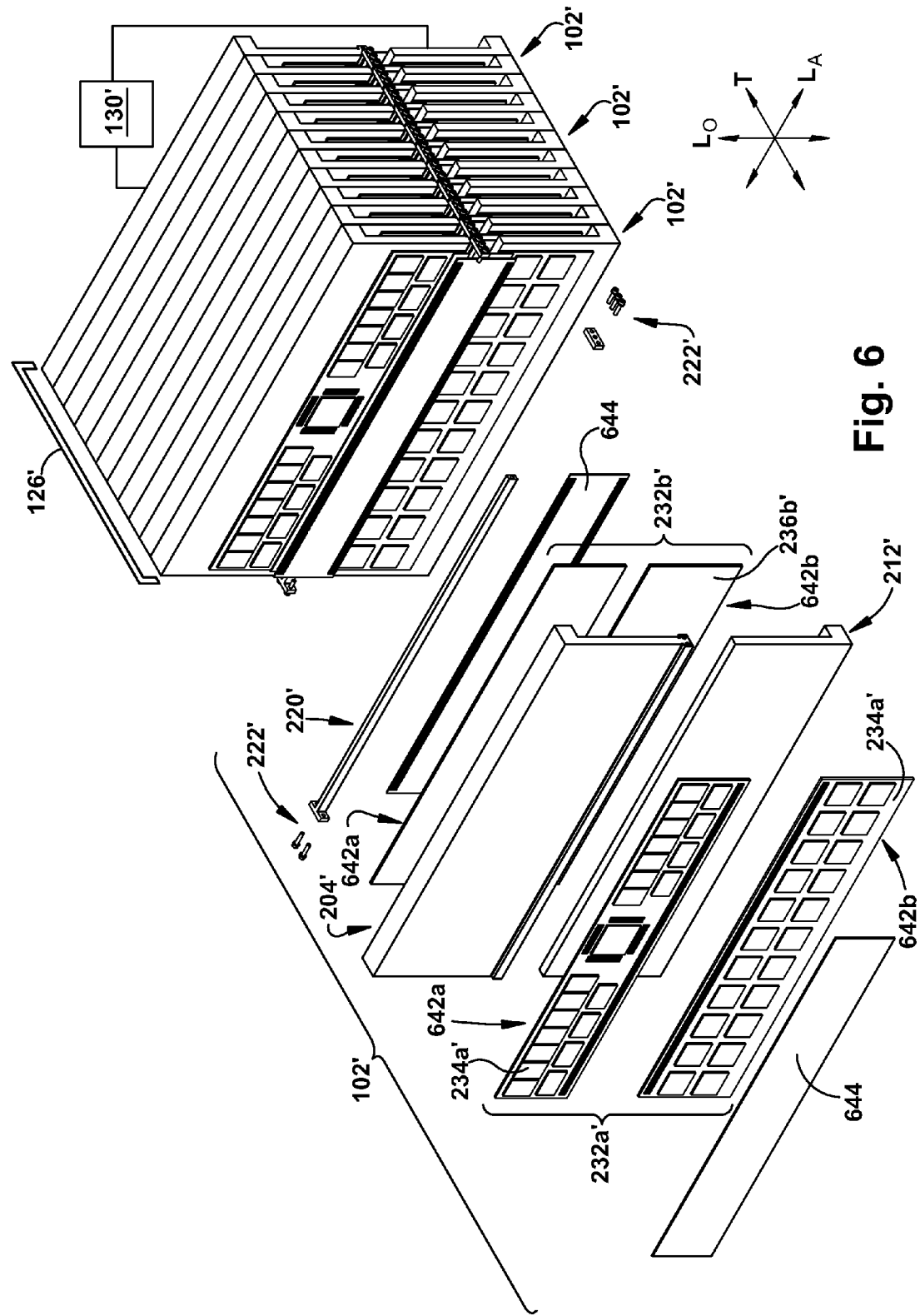
FIG. 6 is a partially exploded perspective view of the aspect of FIG. 5.
Figure 7:
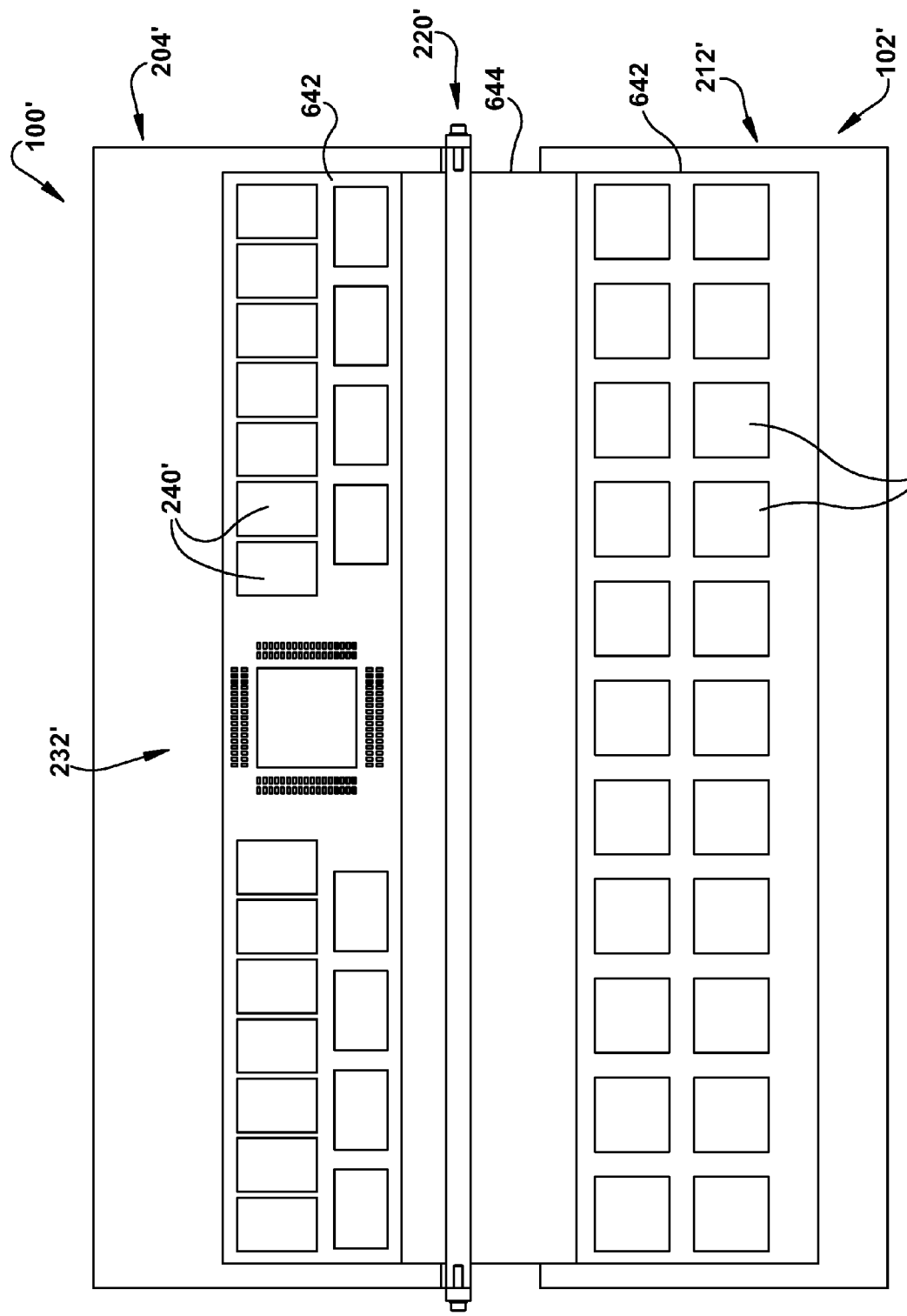
FIG. 7 is a front view of the aspect of FIG. 5.
Figure 8:
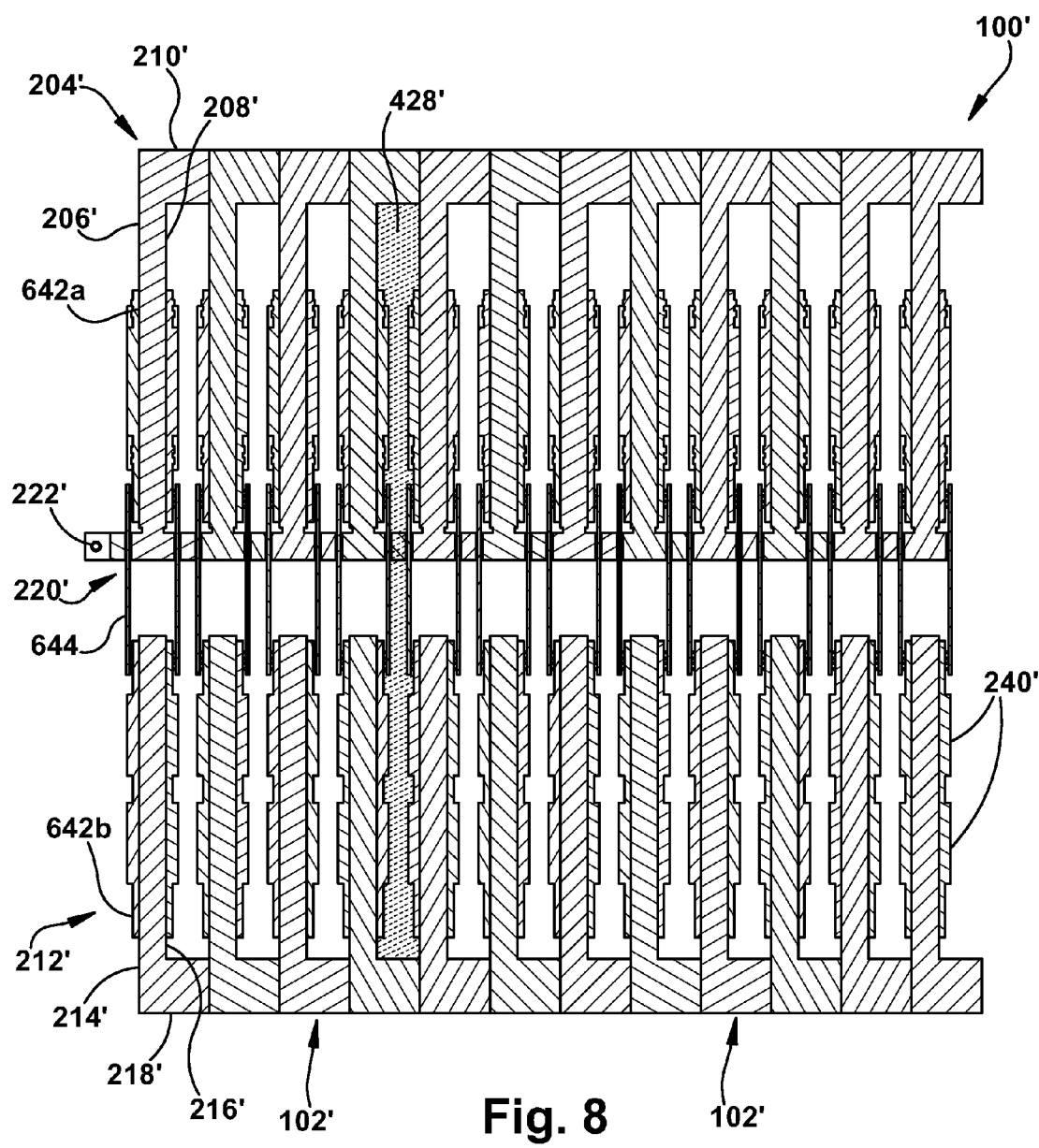
FIG. 8 is a sectional view taken along line 8-8 of FIG. 5.

Each card unit 102 includes a substantially planar first thermal plate 204 having front and back first plate sides 206 and 208, respectively, oriented in a lateral-longitudinal plane ("LLP", which is substantially coincident with the plane of the page in FIG. 3). The front and back first plate sides 206 and 208 are separated transversely by a first plate thickness 210 which is significantly smaller than a length of the first thermal plate 204 in both the lateral and longitudinal directions (i.e., the first thermal plate 204 is much thinner than it is wide or tall). The first thermal plate 204 has an operative configuration at a first plate temperature, which could involve heating and/or cooling thermal energy. For example, for certain superconducting supercomputer configurations, the first thermal plate 204 could be configured with a predetermined first plate temperature chosen to provide an adjacent structure (such as a circuit card, as discussed below) with a temperature in the range of about 2-6K, such as about 4K.

The card unit also includes a substantially planar second thermal plate 212 having front and back second plate sides 214 and 216, respectively, which are oriented in substantially the same lateral-longitudinal plane (LLP) as the first thermal plate 204. The front and back second plate sides 214 and 216 are separated transversely by a second plate thickness 218 which is significantly smaller than a length of the second thermal plate 212 in both the lateral and longitudinal directions (i.e., the second thermal plate 212 is much thinner than it is wide or tall). The second thermal plate 212 has an operative configuration at a second plate temperature which is different than the first plate temperature. For example, for certain superconducting supercomputer configurations, the second thermal plate 212 could be configured with a predetermined second plate temperature chosen to provide an adjacent structure (such as a circuit card, as discussed below) with a temperature in the range of about 75-79K, such as about 77K. However, it is contemplated that the apparatus 100 could be used in any desired environment, such as, but not limited to, a non-cryogenic environment, any multi-temperature environment, or even in a single-temperature environment (though the parasitic thermal losses would not be present there as in a dual-temperature environment).

The first and second thermal plates 204 and 212 could be of any desired type, either active (e.g., including fluid flow channels, not shown) or passive. For example, the first and/or second thermal plates 204 and 212 could be thick plates made from any suitable material, such as, but not limited to, ceramics and/or metals including steel, aluminum, and copper. For most use environments, the first and second thermal plates 204 and 212 should be thermally conductive to assist with thermal energy transfer as described below.

The apparatus 100 also includes a laterally extending plate coupler 220 oriented in substantially the same lateral-longitudinal plane (LLP) as the first and second thermal plates 204 and 212. The plate coupler 220 is directly or indirectly connected to at least one of the front and back first plate sides 206 and 208, such as via fasteners 222 and optionally one or more intermediate plates 224, as shown. For example, the intermediate plate 224 shown in the Figures could include a low thermal conductivity circuit interconnect between the hot and cold sides of the apparatus 100. The plate coupler 220 is also directly or indirectly connected to at least one of the front and back second plate sides 214 and 216 to maintain the first and second thermal plates 204 and 212 in relative longitudinal spacing to form a card unit 102.

The plate coupler 220 may be made of any suitable material or combination of materials. The plate coupler 220 may be gold-plated or otherwise treated to help reflect thermal energy. Similarly, the plate coupler 220 may be made of a material having a high relative magnetic permeability or otherwise configured to block magnetic field transfer. Commonly used high permeability materials include alloys, such as Carpenter High Permeability 49® and/or Carpenter HyMu 80® (trademarks of Carpenter Technology Corporation of Reading, Pa.), whose compositions are respectively a 48% nickel-iron alloy and an unoriented 80% nickel-iron-molybdenum alloy.

As shown in the Figures, the plurality of card units 102 are arranged in a transversely oriented "stack" configuration with at least a portion of the front first and second plate sides 206 and 214 of a second card unit 102b being directly transversely adjacent at least a corresponding portion of the back first and second plate sides 208 and 216 of a first card unit 102a. Optionally, and as shown, one or both of the front and back first and second plate sides 206, 208, 214, 216 (here, the back first and second plate sides 208 and 216) may be contoured or stepped to accommodate other "internal" structures while still providing a relatively smooth or constant-depth top/bottom (i.e., transversely-oriented) surface to the "stack" as a whole. Optionally a bracket or other "bundling" structure of any desired type (shown schematically as alignment guide 126 in FIG. 1) may be used to maintain the "stack" or "block" configuration of the plurality of card units 102.

The plate coupler 220 occupies at least a portion of a space (one example space is hatched at 428 in FIG. 4) transversely between adjacent first and second card units 102a and 102b and longitudinally between the first and second thermal plates 204 and 212 of at least one of the first and second card units 102a and 102b. The presence of the plate coupler 220 may help to restrict at least one of magnetic, thermal, and radiation transmission longitudinally between the first and second thermal plates 204 and 212. For example, the plate coupler 220 may at least partially "fill" the space 428 transversely between adjacent thermal plates 102 and thus block a potential longitudinal travel path for magnetic, thermal, and/or radiation energy through that space or gap 428 between the thermal plates 102. As another example, the plate coupler could act in a heat shielding and electro-magnetic interference ("EMI") shielding capacity.

A thermal energy transfer device (shown schematically at 130 in FIG. 1) may be operatively connected to at least one of the first and second thermal plates for at least partially inducing the respective first and second plate temperatures. For example, a thermosiphon, Dewar flask, cryocooler, thermo-electric cooler, pulse tube, G-M cooler, dilution refrigeration, or any other thermal energy transfer device 130 could be used to provide desired thermal properties to the apparatus 100.

Figure 1:
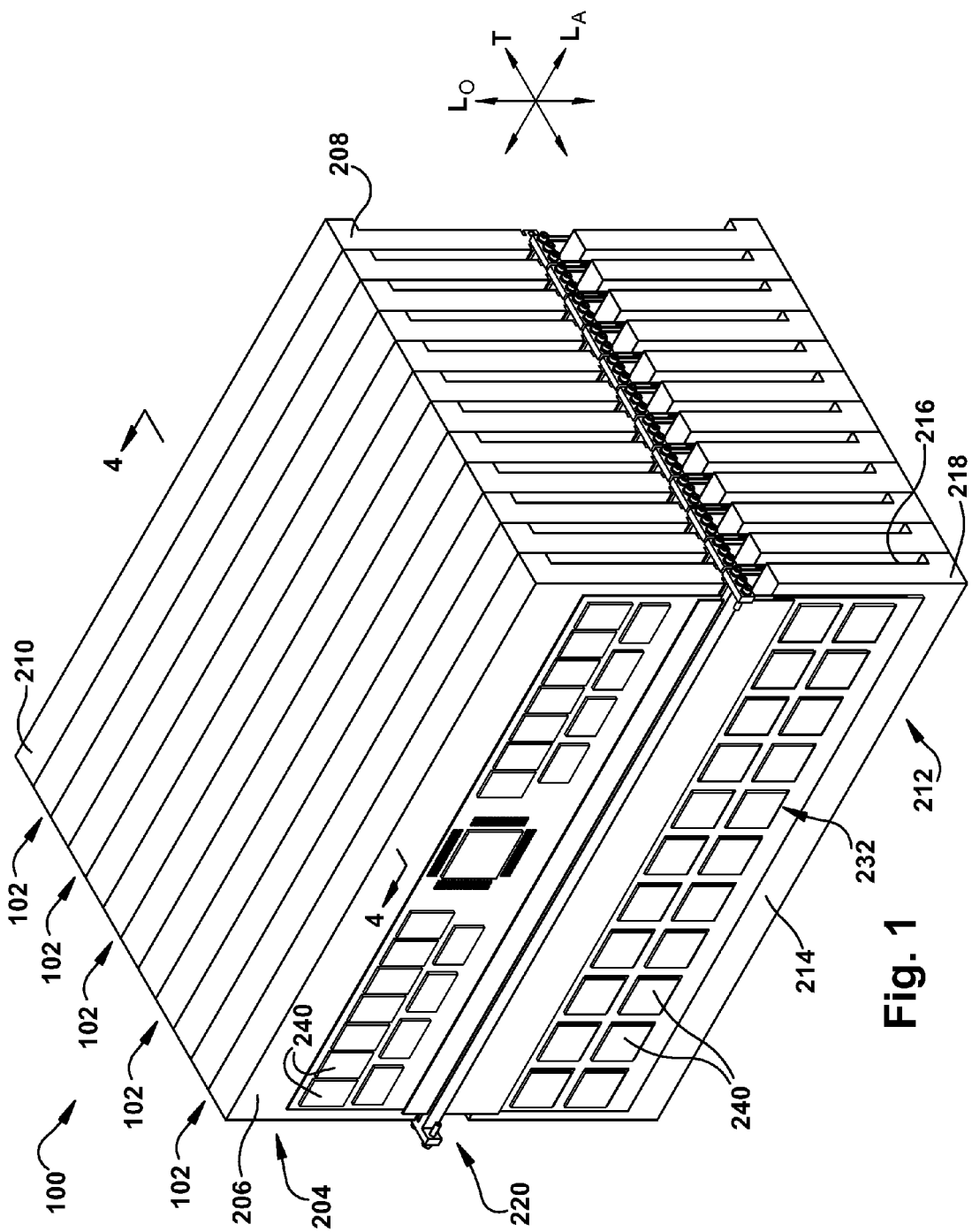
FIG. 1 is a perspective front view of an aspect of the invention.
Figure 2:
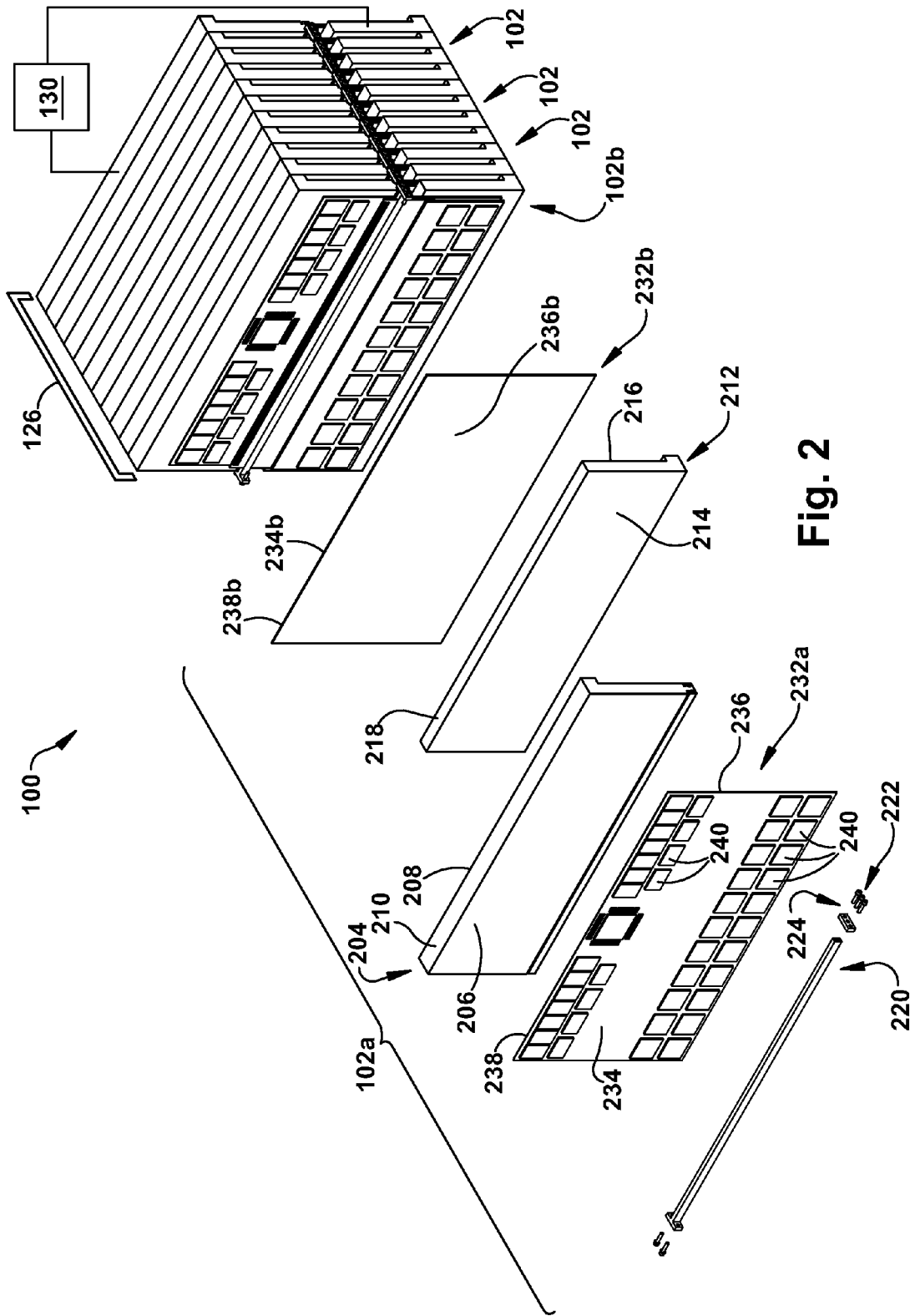
FIG. 2 is a partially exploded perspective view of the aspect of FIG. 1.

One or more card units 102 of the apparatus 100 can include at least one circuit card 232, depicted in FIG. 2, operatively configured to take advantage of the desired temperature-differential circuit card environment created by the apparatus 100. The circuit card 232 has front and back circuit card sides 234 and 236 oriented in a lateral-longitudinal plane and separated transversely by a card thickness 238 which is significantly smaller than a length of the circuit card 232 in both the lateral and longitudinal directions (i.e., the circuit card 232 is much thinner than it is wide or tall). The circuit card 232 carries at least one IC chip 240 on the front circuit card side 234, facing transversely opposite the back circuit card side 236.

The back circuit card side 236 is directly transversely adjacent to the front first and second plate sides 206 and 214 of a selected card unit 102a. Optionally, the circuit card 232 could be directly attached to the front first and second plate sides 206 and 214 of the selected card unit 102a; otherwise, the circuit card 232 could merely be held in close proximity to the front first and second plate sides 206 and 214 of the selected card unit 102a. The circuit card 232 and first and second thermal plates 204 and 212 are operatively configured so that the first and second thermal plates 204 and 212 provide desired thermal energy transfer (e.g., heating and/or cooling) to the circuit card 232 and, by conduction, to the IC chips 240 on the front circuit card side 234. The first and second thermal plates 2014 and 212 could also or instead provide EMI shielding to the IC chips 240 on the front circuit card side 234.

One example of a suitable circuit card 232 is provided in copending U.S. patent application Ser. No. 14/943,299, filed 17 Nov. 2015 and entitled "CIRCUIT CARD ASSEMBLY AND METHOD OF PROVIDING SAME", incorporated herein by reference in its entirety. The circuit card 232, or portions thereof, may, like the plate coupler 220, occupy at least a portion of a space (one example space is hatched at 428 in FIG. 4) transversely between adjacent first and second card units 102a and 102b and/or longitudinally between the first and second thermal plates 204 and 212 of at least one of the first and second card units 102a and 102b. The presence of the circuit card 232, or portions thereof, may help to restrict at least one of magnetic, thermal, and radiation transmission longitudinally between the first and second thermal plates 204 and 212. For example, the plate coupler could act in a heat shielding and electro-magnetic interference ("EMI") shielding capacity.

Optionally, the IC chips 240 of a single circuit card 232 may have different temperature requirements. For example, the longitudinally topmost (in the orientation of the Figures) array of IC chips 240 could have a desired operating temperature in the range of about 2-6K, such as about 4K. Similarly, the longitudinally bottommost (in the orientation of the Figures) array of IC chips 240 could have a desired operating temperature in the range of about 75-79K, such as about 77K. Through use of the first and second thermal plates 204 and 212, the apparatus 100 can provide a desired temperature-differential environment for the circuit cards 232, and the plate coupler 220 can assist with thermal efficiency by blocking, among other energies, thermal energy transfer longitudinally between the longitudinally topmost and bottommost sections of the circuit cards 232.

Stated differently, two longitudinally adjacent circuit card 232 assemblies can be maintained (via their inclusion in the apparatus 100) in close spatial proximity to each other, each at a different temperature, with low thermal parasitic heat transfer between the two circuit card 232 assemblies due to the presence of at least one of a plate coupler 220 and a card connector 644 longitudinally between the two circuit card 232 assemblies.

Optionally, and as shown in the Figures, at least one of the circuit cards 232 is a fore-facing circuit card 232a, and the apparatus 100 includes at least one rear-facing circuit card 232b, carrying at least one IC chip 240b on a front rear-facing circuit card side 234b, facing transversely opposite a back rear-facing circuit card side 236b. The back rear-facing circuit card side 236b is directly transversely adjacent to the back first and second plate sides 208 and 216 of the selected card unit 102. In other words, one or more card units 102 could include oppositely facing circuit cards 232, thus taking advantage of the thermal transfer properties on both the front and back sides of a single thermal plate.

FIGS. 5-8 illustrate a second construct of the apparatus 100' which may differ from that shown in FIGS. 1-4. Therefore, structures of FIGS. 5-8 that are the same as or similar to those described with reference to FIGS. 1-4 are either unnumbered or have the same reference numbers with the addition of a "prime" mark. Description of common elements and operation similar to those in the previously described first construct will not be repeated with respect to the second construct.

The main difference between the apparatus 100' of FIGS. 5-8 and the apparatus 100 of FIGS. 1-4 is the configuration of the circuit card 232'. In FIGS. 5-8, the circuit card 232' includes first and second longitudinally spaced circuit card subassemblies 642a and 642b, connected together into a single circuit card 232' oriented substantially in the lateral-longitudinal plane. The first and second circuit card subassemblies 642a and 642b are connected together by a laterally extending card connector 644 oriented in substantially the same lateral-longitudinal plane as the first and second circuit card subassemblies 642a and 642b. (However, it is contemplated that there might be a slight transverse offset, which does not destroy the substantially coplanar nature of the circuit card 232' components, if a back side of the card connector 644 is attached to the front sides of the circuit card subassemblies 642a and 642b.)

In the apparatus 100' shown in FIGS. 5-8, the card connector 644 can be attached to the first and second circuit card subassemblies 642a and 642b in any desired manner such as, but not limited to, adhesives, soldering, brazing, mechanical clamping, and/or welding. The plate coupler 220 and could be configured to account for any slight offset between the card connector 644 and the first and second circuit card subassemblies 642a and 642b, or any other physical arrangement of the space 428 in the apparatus 100' of FIGS. 5-8.

FIGS. 9-12 illustrate a third construct of the apparatus 100" which may differ from that shown in FIGS. 1-4. Therefore, structures of FIGS. 9-12 that are the same as or similar to those described with reference to FIGS. 1-8 are either unnumbered or have the same reference numbers with the addition of a double "prime" mark. Description of common elements and operation similar to those in the previously described first and second constructs will not be repeated with respect to the third construct.

Figure 9:
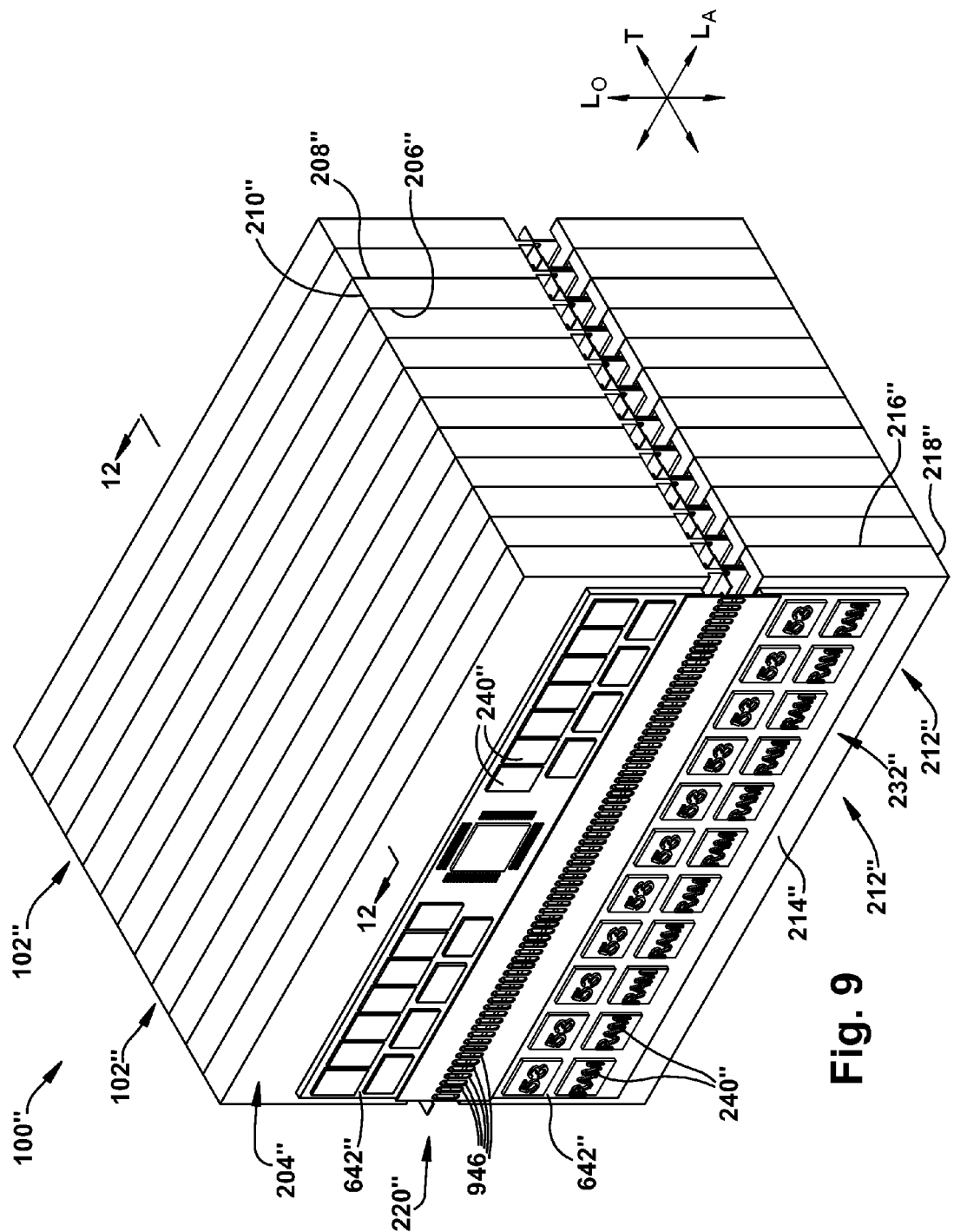
FIG. 9 is a perspective front view of the aspect of FIG. 1.
Figure 10:
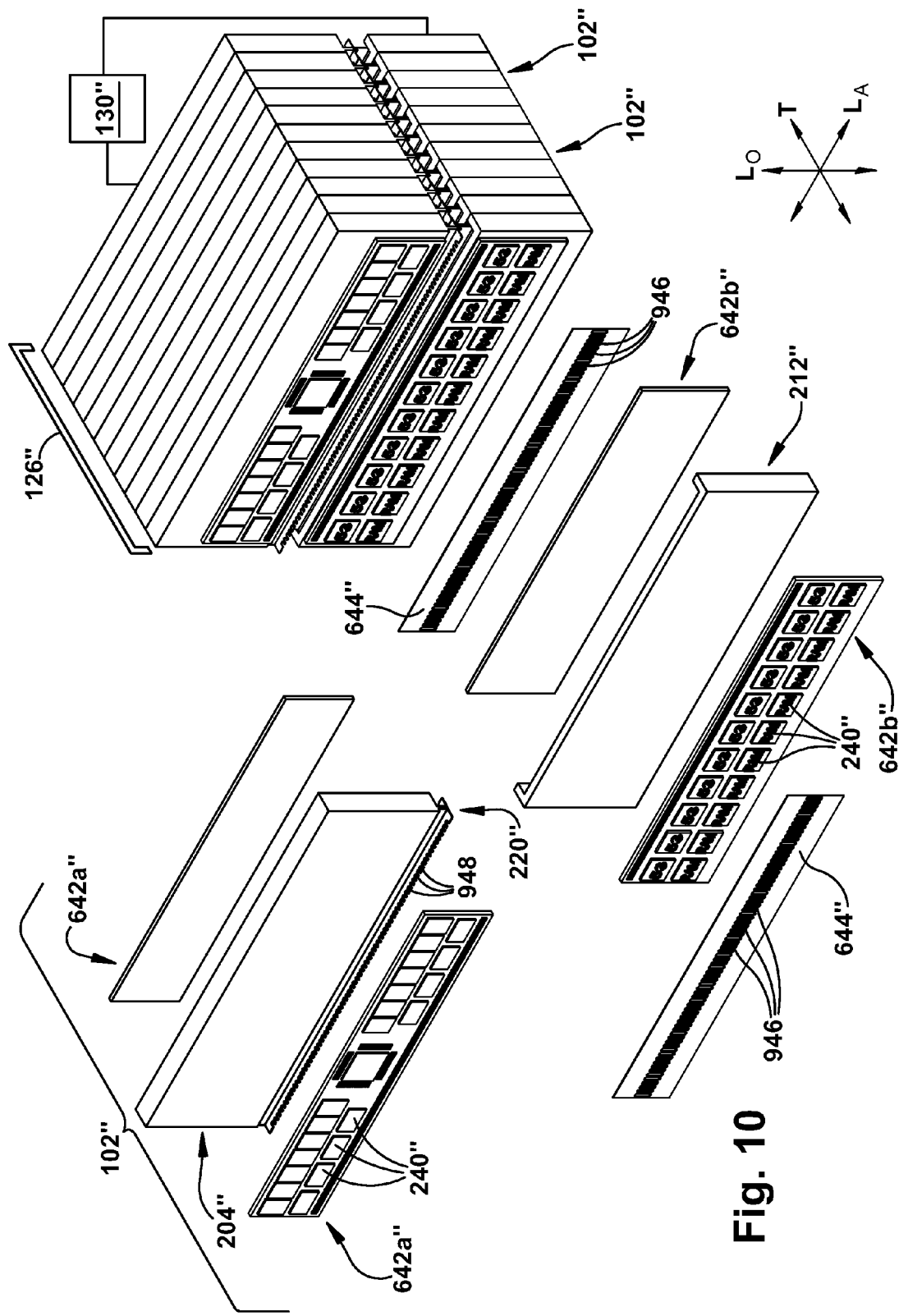
FIG. 10 is a partially exploded perspective view of the aspect of FIG. 9.
Figure 11:
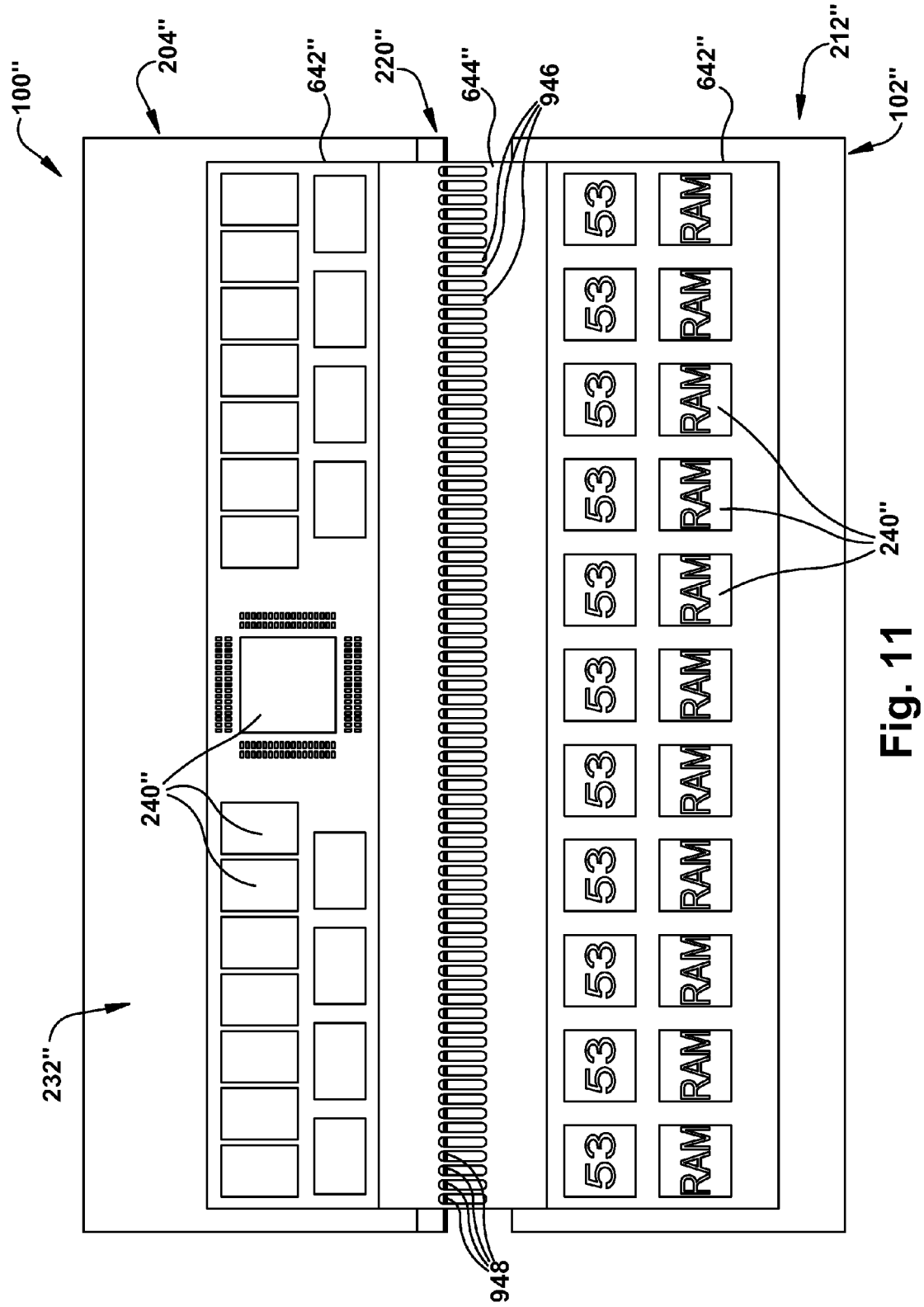
FIG. 11 is a front view of the aspect of FIG. 9.

The main difference between the apparatus 100" of FIGS. 9-12 and the apparatuses 100 and 100' of FIGS. 1-8 is the configuration of the circuit card 232". As shown in FIGS. 9-11, the card connector 644" includes a plurality of connector apertures 946 extending transversely therethrough. The connector apertures 946 may be provided for any reason, such as, for example, to reduce a cross-sectional volume of the card connector 644" and thereby reduce conductive thermal transfer between the circuit card subassemblies 642a" and 642b".

Figure 12:
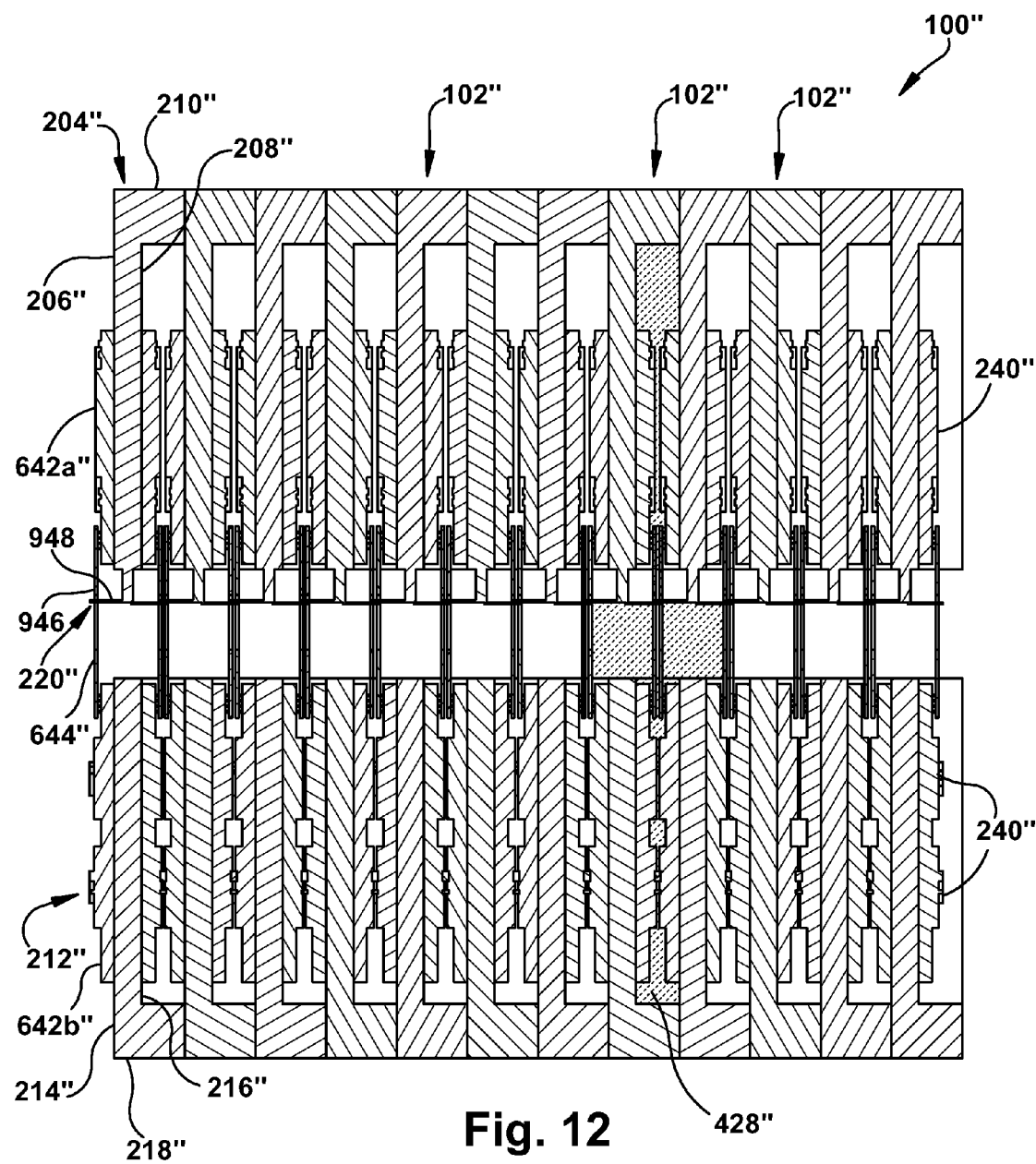
FIG. 12 is a sectional view taken along line 12-12 of FIG. 9.

Accordingly, the plate coupler 220" includes a plurality of transversely extending protrusions 948, each protrusion 948 extending transversely through a corresponding connector aperture 946 when the card units 102 are in the transversely oriented stack, as shown particularly in FIG. 12. The transversely oriented protrusions 948 of the plate coupler 220" may act in concert with the card connector 644" to restrict at least one of magnetic, thermal, and radiation transmission longitudinally between the first and second thermal plates 204" and 212".

Another difference between the apparatus 100" of FIGS. 9-12 and the apparatuses 100 and 100' of FIGS. 1-8 is a structure of the first and second thermal plates 204, 204' and 212, 212'. In the apparatuses 100 and 100' of FIGS. 1-8, the lateral sides of the first and second thermal plates 204, 204' and 212, 212' are open, for ease of access for electrical connection, ease of inspection, or for any other reason. In contrast, the lateral sides of the first and second thermal plates 204" and 212" are closed, thus presenting a relatively solid lateral side to the "stack", as shown in FIG. 9. This solid side surface allows for stacking multiple apparatuses 100 (interfacing common temperatures 4K to 4K and 77K to 77K). This solid lateral side surface may also be used, when present, to assist with attaching cooling (e.g., a thermosiphon) devices to the apparatus 100. However, the thermal plates of any apparatus 100, 100', 100" may be configured as desired by one of ordinary skill in the arr.

It is contemplated that the first and/or second thermal plates 204 and 212 of a single apparatus 100 according to any construct may be configured to provide different desired amounts of thermal energy transfer to various circuit cards 232 within a single apparatus 100. For example, the circuit cards 232 toward the middle (transversely speaking) of a single "stack" of card units 102 may be subject to overheating due to their semi-enclosed position. Accordingly, the first and/or second thermal plates 204 and 212 of the card units 102 in those central positions may be configured to cool more aggressively than corresponding first and/or second thermal plates 204 and 212 of card units 102 located more toward the outside (transversely speaking) of the stack. One of ordinary skill in the art can monitor (e.g., via sensors) and adjust (e.g., via a thermostat) the first and second thermal plates 204 and 212 of an apparatus 100, individually or collectively, to achieve desired thermal effects and accommodate for, or avoid, non-symmetric boundary conditions near the perimeter of the apparatus 100.

While aspects of this disclosure have been particularly shown and described with reference to the example embodiments above, it will be understood by those of ordinary skill in the art that various additional embodiments may be contemplated. For example, the specific methods described above for using the apparatus are merely illustrative; one of ordinary skill in the art could readily determine any number of tools, sequences of steps, or other means/options for placing the above-described apparatus, or components thereof, into positions substantively similar to those shown and described herein. When a plurality of substantially similar elements are provided, only a subset of the elements may be numbered in the Figures, for clarity of depiction, but one of ordinary skill in the art will understand which other, unnumbered structures are largely duplicative and thus should be considered to be labeled with the same or corresponding element numbers to the numbered structures. Any of the described structures and components could be integrally formed as a single unitary or monolithic piece or made up of separate sub-components, with either of these formations involving any suitable stock or bespoke components and/or any suitable material or combinations of materials. Any of the described structures and components could be disposable or reusable as desired for a particular use environment. Any component could be provided with a user-perceptible marking to indicate a material, configuration, at least one dimension, or the like pertaining to that component, the user-perceptible marking aiding a user in selecting one component from an array of similar components for a particular use environment. A "predetermined" status may be determined at any time before the structures being manipulated actually reach that status, the "predetermination" being made as late as immediately before the structure achieves the predetermined status. The circuit cards 232 associated with a single apparatus 100 could be the same or could be different, and could be electrically connected to other circuit cards 232 of the same apparatus or to any other desired structures, in any suitable manner. Though certain components described herein are shown as having specific geometric shapes, all structures of this disclosure may have any suitable shapes, sizes, configurations, relative relationships, cross-sectional areas, or any other physical characteristics as desirable for a particular application. Any structures or features described with reference to one embodiment or configuration could be provided, singly or in combination with other structures or features, to any other embodiment or configuration, as it would be impractical to describe each of the embodiments and configurations discussed herein as having all of the options discussed with respect to all of the other embodiments and configurations. A device or method incorporating any of these features should be understood to fall under the scope of this disclosure as determined based upon the claims below and any equivalents thereof.

Other aspects, objects, and advantages can be obtained from a study of the drawings, the disclosure, and the appended claims.

We claim:

1. An apparatus for providing a desired temperature-differential circuit card environment, the apparatus comprising:
   a plurality of card units, each card unit comprising
      a substantially planar first thermal plate having front and back first plate sides oriented in a lateral-longitudinal plane and separated transversely by a first plate thickness which is significantly smaller than a length of the first thermal plate in both the lateral and longitudinal directions, the first thermal plate having an operative configuration at a first plate temperature,
      a substantially planar second thermal plate having front and back second plate sides oriented in substantially the same lateral-longitudinal plane as the first thermal plate, the front and back second plate sides being separated transversely by a second plate thickness which is significantly smaller than a length of the second thermal plate in both the lateral and longitudinal directions, the second thermal plate having an operative configuration at a second plate temperature which is different than the first plate temperature, and
      a laterally extending plate coupler oriented in substantially the same lateral-longitudinal plane as the first and second thermal plates, the plate coupler being connected to at least one of the front and back first plate sides and the plate coupler being connected to at least one of the front and back second plate sides to maintain the first and second thermal plates in relative longitudinal spacing to form a card unit; and
   the plurality of card units being arranged in a transversely oriented stack with at least a portion of front first and second plate sides of a second card unit being directly transversely adjacent at least a corresponding portion of the back first and second plate sides of the first card unit.

2. The apparatus of claim 1, wherein the plate coupler occupies at least a portion of a space transversely between adjacent first and second card units and longitudinally between the first and second thermal plates of at least one of the first and second card units to restrict at least one of magnetic, thermal, and radiation transmission longitudinally between the first and second thermal plates.

3. The apparatus of claim 1, including at least one circuit card, having front and back circuit card sides oriented in a lateral-longitudinal plane and separated transversely by a card thickness which is significantly smaller than a length of the circuit card in both the lateral and longitudinal directions, the circuit card carrying at least one IC chip on the front circuit card side, facing transversely opposite the back circuit card side, and wherein the back circuit card side is directly transversely adjacent to the front first and second plate sides of a selected card unit.

4. The apparatus of claim 3, wherein the at least one circuit card is a fore-facing circuit card, and including at least one rear-facing circuit card, carrying at least one IC chip on a front rear-facing circuit card side, facing transversely opposite a back rear-facing circuit card side, and wherein the back rear-facing circuit card side is directly transversely adjacent to the back first and second plate sides of the selected card unit.

5. The apparatus of claim 3, wherein the circuit card includes first and second longitudinally spaced circuit card subassemblies, connected together into a single circuit card oriented substantially in the lateral-longitudinal plane, the first and second circuit card subassemblies being connected together by a laterally extending card connector oriented in substantially the same lateral-longitudinal plane as the first and second circuit card subassemblies.

6. The apparatus of claim 5, wherein the card connector includes a plurality of connector apertures extending transversely therethrough.

7. The apparatus of claim 6, wherein the plate coupler includes a plurality of transversely extending protrusions, each protrusion extending transversely through a corresponding connector aperture when the card units are in the transversely oriented stack to restrict at least one of magnetic, thermal, and radiation transmission longitudinally between the first and second thermal plates.

8. The apparatus of claim 1, including a thermal energy transfer device operatively connected to at least one of the first and second thermal plates for at least partially inducing the respective first and second plate temperatures.

9. A method of providing a desired temperature-differential circuit card environment, the method comprising:
   providing a plurality of card units, each card unit comprising
      a substantially planar first thermal plate having front and back first plate sides oriented in a lateral-longitudinal plane and separated transversely by a first plate thickness which is significantly smaller than a length of the first thermal plate in both the lateral and longitudinal directions,
      a substantially planar second thermal plate having front and back second plate sides oriented in substantially the same lateral-longitudinal plane as the first thermal plate, the front and back second plate sides being separated transversely by a second plate thickness which is significantly smaller than a length of the second thermal plate in both the lateral and longitudinal directions, and
      a laterally extending plate coupler oriented in substantially the same lateral-longitudinal plane as the first and second thermal plates;
   connecting the plate coupler to at least one of the front and back first plate sides and connecting the plate coupler to at least one of the front and back second plate sides to maintain the first and second thermal plates in relative longitudinal spacing to form a card unit;

configuring the first thermal plate for operation at a first plate temperature;

configuring the second thermal plate for operation at a second plate temperature which is different than the first plate temperature; and arranging the plurality of card units in a transversely oriented stack with at least a portion of front first and second plate sides of a second card unit being directly transversely adjacent at least a corresponding portion of the back first and second plate sides of the first card unit.

10. The method of claim 9, including restricting at least one of magnetic, thermal, and radiation transmission longitudinally between the first and second thermal plates via placement of the plate coupler within at least a portion of a space transversely between adjacent first and second card units and longitudinally between the first and second thermal plates of at least one of the first and second card units.

11. The method of claim 9, including:

providing at least one circuit card, having front and back circuit card sides oriented in a lateral-longitudinal plane and separated transversely by a card thickness which is significantly smaller than a length of the circuit card in both the lateral and longitudinal directions;

carrying at least one IC chip on the front circuit card side of the circuit card, facing transversely opposite the back circuit card side; and placing the back circuit card side directly transversely adjacent to the front first and second plate sides of a selected card unit.

12. The method of claim 11, wherein the at least one circuit card is a fore-facing circuit card, and including:

providing at least one rear-facing circuit card;

carrying at least one IC chip on a front rear-facing circuit card side of the rear-facing circuit card, facing transversely opposite a back rear-facing circuit card side; and placing the back rear-facing circuit card side directly transversely adjacent to the back first and second plate sides of the selected card unit.

13. The method of claim 11, wherein providing at least one circuit card includes:

providing at least one circuit card having first and second longitudinally spaced circuit card subassemblies;

providing a laterally extending card connector oriented in substantially the same lateral-longitudinal plane as the first and second circuit card subassemblies; and connecting the first and second circuit card subassemblies together into a single circuit card oriented substantially in the lateral-longitudinal plane via the card connector.

14. The method of claim 13, wherein providing a laterally extending card connector includes providing a plurality of connector apertures extending transversely through the card connector.

15. The method of claim 14, wherein the plate coupler includes a plurality of transversely extending protrusions, and including:

extending each protrusion transversely through a corresponding connector aperture when the card units are in the transversely oriented stack; and restricting at least one of magnetic, thermal, and radiation transmission longitudinally between the first and second thermal plates with the plurality of protrusions.

16. The method of claim 9, including:

providing a thermal energy transfer device;

operatively connecting the thermal energy transfer device to at least one of the first and second thermal plates; and inducing the respective first and second plate temperatures at least partially with the thermal energy transfer device.

* * * * *